United States Patent
Layman et al.

(10) Patent No.: US 7,056,783 B2
(45) Date of Patent: Jun. 6, 2006

(54) MULTIPLE OPERATING VOLTAGE VERTICAL REPLACEMENT-GATE (VRG) TRANSISTOR

(75) Inventors: Paul Arthur Layman, Orlando, FL (US); John Russell McMacken, Orlando, FL (US); J. Ross Thomson, Clermont, FL (US); Samir Chaudhry, Orlando, FL (US); Jack Qingsheng Zhao, Orefield, PA (US)

(73) Assignee: Agere Systems Inc., Allentown, PA (US)

(*) Notice: Subject to any disclaimer, the term of this patent is extended or adjusted under 35 U.S.C. 154(b) by 203 days.

(21) Appl. No.: 10/684,713

(22) Filed: Oct. 14, 2003

(65) Prior Publication Data

US 2005/0048709 A1   Mar. 3, 2005

Related U.S. Application Data

(62) Division of application No. 09/961,477, filed on Sep. 21, 2001, now Pat. No. 6,686,604.

(51) Int. Cl.
H01L 21/8238 (2006.01)
H01L 21/8234 (2006.01)
H01L 21/469 (2006.01)

(52) U.S. Cl. .............. 438/209; 438/268; 438/275; 438/787; 438/981

(58) Field of Classification Search ............. 438/275, 438/268, 209, 212, 138, 585, 773, 787, 981
See application file for complete search history.

(56) References Cited

U.S. PATENT DOCUMENTS

| | | | |
|---|---|---|---|
| 4,366,495 A | 12/1982 | Goodman et al. | |
| 4,455,565 A | 6/1984 | Goodman et al. | |
| 4,587,713 A | 5/1986 | Goodman et al. | |
| 4,657,628 A * | 4/1987 | Holloway et al. | .......... 438/647 |
| 4,670,768 A | 6/1987 | Sunami et al. | |
| 4,683,643 A | 8/1987 | Nakajima et al. | |
| 4,786,953 A | 11/1988 | Morie et al. | |
| 4,837,606 A | 6/1989 | Goodman et al. | |
| 4,951,102 A | 8/1990 | Beitman et al. | |
| 4,951,117 A * | 8/1990 | Kasai | ............. 257/334 |
| 5,010,386 A | 4/1991 | Groover, III | |
| 5,140,388 A | 8/1992 | Bartelink | |
| 5,208,172 A | 5/1993 | Fitch et al. | |
| 5,342,797 A | 8/1994 | Sapp et al. | |
| 5,414,289 A | 5/1995 | Fitch et al. | |
| 5,502,009 A | 3/1996 | Lin | |
| 5,545,586 A | 8/1996 | Koh | |
| 5,554,870 A | 9/1996 | Fitch et al. | |
| 5,576,238 A | 11/1996 | Fu | |
| 5,668,391 A | 9/1997 | Kim et al. | |
| 5,744,846 A | 4/1998 | Batra et al. | |
| 5,861,347 A | 1/1999 | Maiti et al. | |
| 5,864,158 A | 1/1999 | Liu et al. | |
| 6,027,975 A | 2/2000 | Hergenrother et al. | |
| 6,072,216 A | 6/2000 | Williams et al. | |
| 6,133,099 A | 10/2000 | Sawada | |
| 6,133,164 A | 10/2000 | Kim | |
| 6,197,641 B1 | 3/2001 | Hergenrother et al. | |
| 6,268,621 B1 | 7/2001 | Emmi et al. | |
| 6,297,531 B1 | 10/2001 | Armacost et al. | |
| 6,300,199 B1 | 10/2001 | Reinberg | |
| 6,309,930 B1 | 10/2001 | Goebel et al. | |
| 6,387,758 B1 | 5/2002 | Yu et al. | |
| 6,475,866 B1 | 11/2002 | Hofmann et al. | |

OTHER PUBLICATIONS

Dudek, et al, "Lithography-Independent Nanometer Silicon MOSFET's on Insulator", IEEE Transactions on Electron Devices, vol. 43, No. 10, Oct. 1996, pp. 1626-1631.

Risch, et al, "Vertical MOS Transistors with 70 nm Channel Length", IEEE Transactions on Electron Devices, vol. 43, No. 9, Sep. 1996, pp. 1495-1498.

Takato, et al, "Impact of Surrounding Gate Transistor (SGT) for Ultra-High-Density LSI's", IEEE Transactions on Electron Devices, vol. 38, No. 3, Mar. 1991, pp. 573-577.

Takato, et al, "High Performance CMOS Surrounding Gate Transistor (SGT) for Ultra High Density LSIs", IEDM 1988, pp. 222-225.

Hergenrother, et al, "The Vertical Replacement-Gate (VRG) MOSFET: A 50-nm Vertical MOSFET withLithography-Independent Gate Length", Technical Digest of IEDM, 1999, pp. 75-78.

Oh, et al, "50 nm Vertical Replacement-Gate (VRG) pMOSFETs", IEEE 2000.

Monroe, et al, "The Vertical Replacement-Gate (VRG) Process for Scalable, General-purpose Complementary Logic", Paper 7.5, pp. 1-7, date and publication information unknown.

* cited by examiner

*Primary Examiner*—Michael Lebentritt
*Assistant Examiner*—Ron Pompey (57) ABSTRACT

An architecture for creating multiple operating voltage MOSFETs. Generally, an integrated circuit structure includes a semiconductor area with a major surface formed along a plane and first and second spaced-apart doped regions formed in the surface. A third doped region forming a channel of different conductivity type than the first region is positioned over the first region. A fourth doped region of a different conductivity and forming a channel is positioned over the second region. The process of creating the gate structure for each of the two transistors allows for the formation of oxide layers of different thickness between the two transistors. The transistors are therefore capable of operating at different operating voltages (including different threshold voltages). Each transistor further includes fifth and sixth layers positioned respectively over the third and fourth regions and having an opposite conductivity type with respect to the third and fourth regions.

In an associated method of manufacturing the semiconductor device, a first and second source/drain regions are formed in a semiconductor layer. A first field-effect transistor gate region, including a channel and a gate electrode is formed over the first source drain region and a second field-effect transistor gate region is formed over the second source/drain region. Fifth and sixth source/drain regions are then formed for each of the first and second field-effect transistors and further having the appropriate conductivity type. Variable thickness gate oxides are created by appropriately masking, etching, and regrowing gate oxides. As a result, the formed transistors operate at different operating voltages. Thus a plurality of such transistors operating at different operating voltage (as a function of the gate oxide thickness) can be formed in an integrated circuit.

7 Claims, 11 Drawing Sheets

MULTIPLE OPERATING VOLTAGE VERTICAL REPLACEMENT-GATE (VRG) TRANSISTOR

This application claims the benefit of application Ser. No. 09/961,477 filed on Sep. 21, 2001, U.S. Pat. No. 6,686,604.

FIELD OF THE INVENTION

The present invention is directed to semiconductor devices incorporating junctions of varying conductivity types designed to conduct current and methods of making such devices. More specifically, the present invention is directed to vertical replacement-gate (VRG) field-effect transistor devices operating at different operating voltages and methods for fabricating integrated circuits incorporating such devices.

BACKGROUND OF THE INVENTION

Enhancing semiconductor device performance and increasing device density (the number of devices per unit area), continue to be important objectives of the semiconductor industry. Device density is increased by making individual devices smaller and packing devices more compactly. But, as the device dimensions (also referred to as the feature size or design rules) decrease, the methods for forming devices and their constituent elements must be adapted. For instance, production device sizes are currently in the range of 0.25 microns to 0.18 microns, with an inexorable trend toward smaller dimensions. However, as the device dimensions shrink, certain manufacturing limitations arise, especially with respect to the lithographic processes. In fact, current lithographic processes are nearing the point where they are unable to accurately manufacture devices at the required minimal sizes demanded by today's device users.

Currently most metal-oxide-semiconductor field effect transistors (MOSFETs) are formed in a lateral configuration, with the current flowing parallel to the plane of the substrate or body surface. As the size of these MOSFET devices decreases to achieve increased device density, the fabrication process becomes increasingly difficult. In particular, the lithographic process for creating the gate channel is problematic, as the wavelength of the radiation used to delineate an image in the lithographic pattern approaches the device dimensions. Therefore, for lateral MOSFETs, the gate length is approaching the point where it cannot be precisely controlled through the lithographic techniques.

Recent advances in packing density have resulted in several variations of a vertical MOSFET. In particular, the vertical device described in Takato, H., et al., "Impact of Surrounding Gates Transistor (SGT) for Ultra-High-Density LSI's, *IEEE Transactions on Electron Devices*, Volume 38(3), pp. 573–577 (1991), has been proposed as an alternative to the planar MOSFET devices. Recently, there has been described a MOSFET characterized as a vertical replacement gate transistor. See Hergenrother, et al, "The Vertical-Replacement Gate (VRG) MOSFET" A50-nm Vertical MOSFET with Lithography-Independent Gate Length," *Technical Digest of the International Electron Devices Meeting*, p. 75, 1999.

Figure 1:
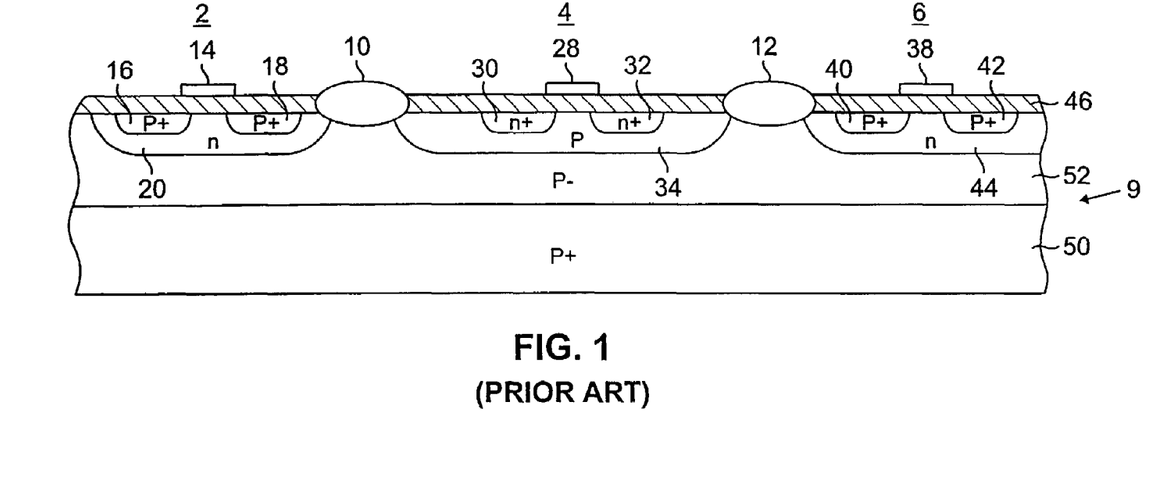
FIG. 1 is a cross-sectional view of a prior art CMOS integrated circuit.
Figure 2:
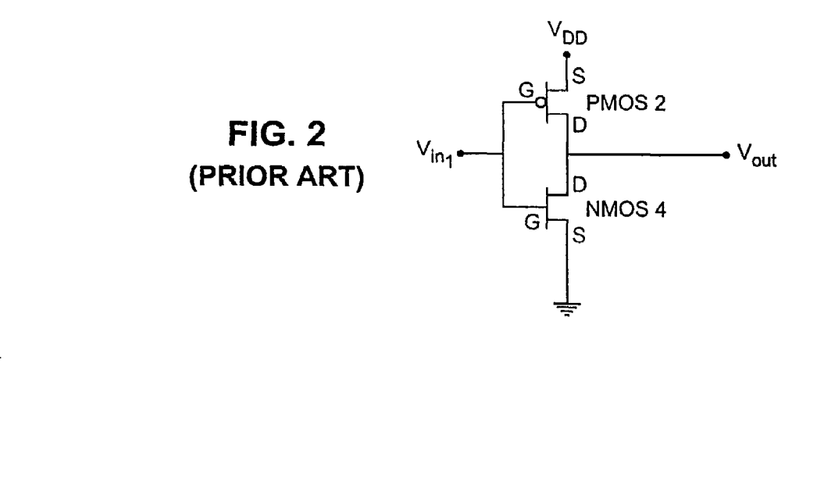
FIGS. 2 through 4 are partial schematics of CMOS integrated circuits.

A plurality of planar MOSFET active devices fabricated on an integrated circuit chip are shown in the FIG. 1 cross-sectional view. A substrate 9 comprises a p+ region 50 and a p− layer 52, the latter typically grown by an epitaxial technique. MOSFETs (metal-oxide-semiconductor field-effect transistor) 2, 4 and 6 are fabricated in the substrate 9. The MOSFET 2 is separated from the MOSFET 4 by a LOCOS (local oxidation on silicon substrate) region 10. Similarly, the MOSFET 6 is separated from the MOSFET 4 by a LOCOS region 12. Alternatively, the MOSFETS 2, 4 and 6 may be electrically separated by shallow trench isolation (STI) techniques. The MOSFET 2 includes a gate 14 and a source region 16 and a drain region 18 diffused in an n-type well 20. The MOSFET 4 includes a gate 28 and a source region 30 and a drain region 32 diffused in a p-type well 34. Finally, the MOSFET 6 includes a gate 38 and a source region 40 and a drain region 42 diffused in an n-type well 44. The gates 14, 28 and 38 are separated from the substrate 9 by a silicon dioxide layer 46, also referred to as a gate oxide layer. As FIG. 1 is intended to be a simplified representation of a portion of an integrated circuit, the various contacts, interconnects, vias and metal layers are not shown and the features are not drawn to scale. It is particularly advantageous, especially in digital applications, to fabricate a combination of an n-channel and a p-channel MOSFETs on adjacent regions of a chip. This complementary MOSFET (CMOS) configuration is illustrated in the form of a basic inverter circuit in FIG. 2. The drains of the MOSFETs (for instance the MOSFETs 2 and 4 in FIG. 1) are connected together and form the output ($V_{out}$). The input terminal ($V_{in}$) is formed by the common connection of the MOSFET gates (for example the gates 14 and 28 of FIG. 1). The operating voltage is designated by $V_{DD}$. In the FIG. 2 schematic, the MOSFET 2 is the PMOS device and the MOSFET 4 is the NMOS device illustrated in the FIG. 1 cross-section.

State-of-the-art integrated circuit fabrication combines many different functions and subsystems onto a single chip, for example, combining different types of logic circuits, logic families and memory elements. For optimal performance and minimal power consumption individual devices on the integrated circuit may operate at different voltages. Thus, the active devices must be fabricated with the necessary physical characteristics to accommodate the selected operating voltage. But in creating these physical device characteristics, it is also desirable to minimize and simplify the number of fabrication process steps.

For example, each of the MOSFETs 2, 4 and 6 of FIG. 1, may be designed to operate at a different operating voltage, i.e., $V_{dd}/V_{SS}$. It is desired to establish the device operating voltage at the minimum value that provides the desired performance to minimize the power consumption of the devices, and overall, the power consumption of the chip. It is known, however, that there is a counter-effect; as the device operating voltage is reduced the operating speed of the device is also reduced. Therefore, to establish the optimum value for both of these parameters, it is necessary to operate the individual devices at operating voltages consistent with the desired speed performance. To provide multiple operating voltages, a printed circuit board carrying several integrated circuits includes multiple voltage regulators to supply the optimum operating voltage to each chip. Further, an individual chip may include on-chip voltage divider and regulator circuits so that the devices within the chip are supplied with the optimum operating voltage.

Given that there may be multiple operating voltages on a chip, there may also be multiple output voltages produced by the active elements and circuits of the chip. Thus the input circuit or device responsive to the preceding output voltage must be able to accommodate that output voltage. For example, a first on-chip circuit (which may comprise a single active element or a plurality of active elements, such as a CMOS circuit) has an output voltage ranging from zero volts to two volts, representing, respectively, a binary zero and a binary one. The output voltage of another circuit element is zero volts for a binary zero and five volts for a binary one. Therefore, the MOSFET gate terminal (the input terminal of the MOSFET device) must be designed to accommodate the voltage range of the output signal from the previous device in the circuit chain. Thus, returning to the above example, certain MOSFET gate voltages must accommodate a voltage range of zero to two volts, while others must accommodate a voltage range of zero to five volts. Once the gate driving voltage is known, the MOSFET gate must be designed and fabricated to ensure that the gate can withstand that voltage. Thus, MOSFETs operating at higher gate voltages will have thicker oxides to prevent gate oxide breakdown at the higher operating voltages. Since the gate oxide thickness effects the threshold voltage, it is also necessary to ensure that the MOSFET will be driven into conduction by the gate input voltage. This can be accomplished by adjusting the other factors that influence the threshold voltage, such as the doping level of the channel region and the work function of the channel and gate materials.

One technique for varying the thickness of oxide growth involves nitrogen implantation in the material to be oxidized. See for example the article entitled "High Performance 0.2 μm CMOS with 25 Angstroms Gate Oxide Grown on Nitrogen Implanted Silicon Substrates," by C. T. Liu, et al, IEDM, 1996, pp. 499–502. As is known, nitrogen implantation before a thermal oxide growth process results in inhibition of the oxide growth. Large nitrogen dosages produce thin oxides. This process is not applicable to a MOSFET constructed according to the teachings of the present invention because acceptable access cannot be gained to the region where the gate is formed to implant the nitrogen.

BRIEF SUMMARY OF THE INVENTION

To provide further advances in the use of multiple operating voltages for semiconductor devices, an architecture is provided for creating vertical replacement gate (VRG) MOSFET devices operating at different threshold voltages.

According to one embodiment of the invention, a semiconductor device includes a first layer of semiconductor material and first and second spaced-apart doped regions formed therein. A third doped region of a different conductivity type than the first and the second regions is formed over the first region. A fourth doped region is formed over the second doped region with a different conductivity type than the second doped region. First and second oxide layers of a different thickness are formed proximate to the third and fourth doped regions, respectively.

The first spaced-apart region is a source/drain region of a first field-effect transistor, and the third doped region is the channel. The source/drain region of a second field-effect transistor comprises the second spaced-apart doped region and the fourth doped region forms the channel thereof A second source/drain region for each MOSFET is formed over each of the channels.

Since, as discussed above, the output voltage of one active device on a chip may serve as the input voltage for the next active device in the circuit chain, the latter must be capable of handling the input voltage within its performance parameters. Since the input terminal for a MOSFET is the gate, the MOSFET gate must be designed to withstand the output voltage from the previous device. In CMOS circuitry, the output voltage is typically the operating voltage or $V_{dd}$. Therefore, the gate must be able to withstand the operating voltage of the device to which it is responsive. The gate parameter of interest to avoid gate breakdown is the gate oxide thickness. Since the MOSFET threshold voltage is also a function of the gate oxide thickness, changing the thickness to accommodate the input operating voltage (for example, making the gate oxide thicker) may have a detrimental effect on the threshold voltage. However, if the threshold voltage resulting from the required oxide thickness is not acceptable, it can be modified by changing one or more of the other factors that effect the threshold voltage, for example, the work function difference of the MOSFET materials, or the channel doping, which in turn effects the surface potential.

In an associated method of manufacture, an integrated circuit structure is fabricated by providing a semiconductor layer suitable for device formation and having a surface formed along a first plane. For a first vertical field-effect transistor a first device region is formed in the semiconductor layer, wherein the device region is selected from among a source and a drain region. For a second vertical field-effect transistor a second device region is formed in the semiconductor layer, wherein the second device region is selected from among a source and a drain region. Gate regions for each of the first and the second field-effect transistors are formed above the first and the second device regions, respectively. Each gate region has a different thickness if the two devices are to operate at different threshold voltages. In fabricating the vertical transistors, the gate oxide layer thickness is controlled by the use of masking and etching steps. With this technique a plurality of field-effect transistor are created wherein each has a threshold voltage established to appropriately interface with the output signal from the previous circuit element.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale, but are drawn to emphasize specific features relevant to the invention. Reference characters denote like elements throughout the figures and text.

DETAILED DESCRIPTION OF THE INVENTION

The described embodiments include CMOS structures and associated fabrication techniques. A process for fabricating CMOS vertical MOSFETs is described in commonly-owned patent application U.S. Ser. No. 290,533, entitled, "A CMOS Integrated Circuit Having Vertical Transistors and a Process for Fabricating Same," filed on Jan. 18, 1999, and incorporated herein by reference. A more general description of the structure and fabrication of vertical transistor MOSFETs (of either the NMOS or PMOS type) is set forth in commonly assigned U.S. Pat. No. 6,027,975, also incorporated herein by reference.

Figure 3:
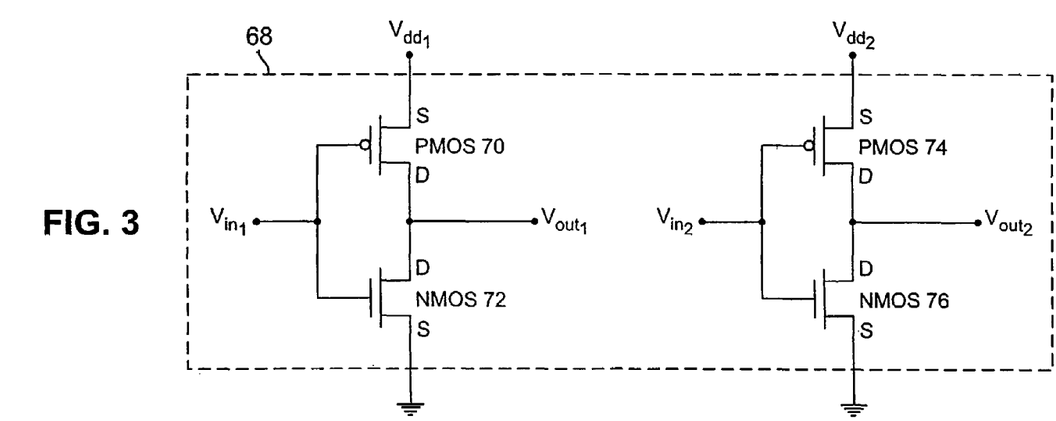

FIG. 3 is a partial schematic of a CMOS integrated circuit 68 illustrating two pairs of CMOS devices. PMOS 70 and NMOS 72 form a first CMOS pair; PMOS 74 and NMOS 76 form a second CMOS pair. $V_{in_1}$ is the gate driving signal for PMOS 70 and NMOS 72, which creates an output signal ($V_{out_1}$) at the common drain connection. $V_{in_2}$ is the gate signal for the CMOS pair PMOS 74 and NMOS 76, which produce an output signal $V_{out_2}$. Note further that PMOS 70 is responsive to a drain voltage $V_{dd_1}$, and PMOS 74 is responsive to a drain voltage $V_{dd_2}$. The drain voltages $V_{dd_1}$ and $V_{dd_2}$ may be produced off-chip or on-chip, although they are illustrated in FIG. 3 as originating from an off-chip voltage source. Because in one embodiment $V_{dd_1}$ and $V_{dd_2}$ are not equal, $V_{out_1}$ is not equal to $V_{out_2}$. In a typical circuit configuration, both output signals $V_{out_1}$ and $V_{out_2}$ may drive the next active element in a circuit chain. For instance, $V_{out_1}$ can serve as the input signal $V_{in_2}$, and $V_{out_2}$ can be supplied to another active element in the integrated circuit 68 or sent off-chip. $V_{in_1}$ may be produced by another circuit within the integrated circuit 68 or originate from an off-chip source. In any case, it is clear that the use of different operating voltages (as established by the operating voltages $V_{dd_1}$ and $V_{dd_2}$) produce different output voltages at the output terminals of the CMOS circuit. As a result, the CMOS pair comprising PMOS 70 and NMOS 72 must be fabricated to respond to a first range of input signals provided as $V_{in_1}$. Further, if $V_{dd_1}$ is not equal to $V_{dd_2}$, the CMOS pair comprising PMOS 74 and NMOS 76 must accommodate the range of input voltages represented by $V_{in_2}$. In particular, the gate circuits of PMOS 70, NMOS 72, PMOS 74 and NMOS 76, must be fabricated to accommodate the range of input voltages $V_{in_1}$ and $V_{in_2}$, respectively.

Figure 4:
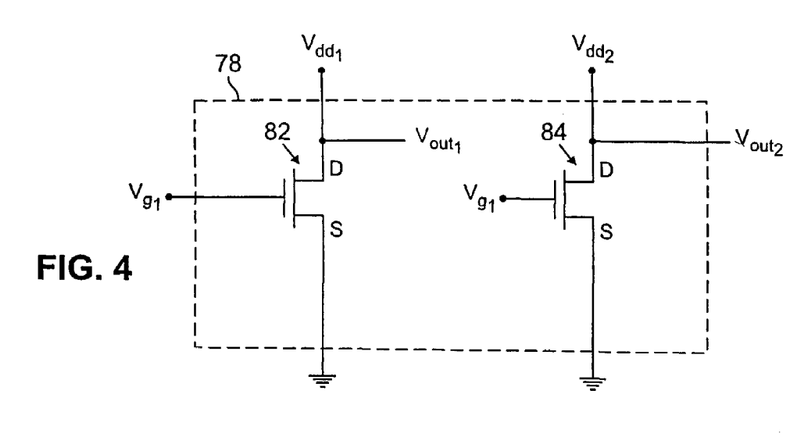

FIG. 4 illustrates another exemplary integrated circuit 78 comprising an NMOS device 82 and an NMOS device 84. As in FIG. 3, the input signals $V_{g_1}$ and $V_{g_2}$ may not be in the same voltage range and thus the NMOS devices 82 and 84 must be fabricated to accommodate the applicable input signal range. Note, in this case that the drain terminal of both NMOS 82 and NMOS 84 are connected to a single supply voltage, $V_{dd_1}$. The fact that each transistor is operated from the same supply voltage is not determinative of the gate structure required to accommodate the gate input signals. The drain voltage for each transistor (whether it is the same for each, or different) determines only the output voltage from the device. Because the MOSFET operating voltages are chosen based on a number of design and operating characteristics, it is likely that several operating voltages will be utilized on a state-of-the-art integrated circuit.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated. The term "vertical transistor" means a transistor with individual semiconductor components vertically oriented with respect to the major surface so that the current flows vertically from source to drain. By way of example, for a vertical MOSFET, the source, channel and drain regions are formed in relatively vertical alignment with respect to the major surface.

Figure 13:
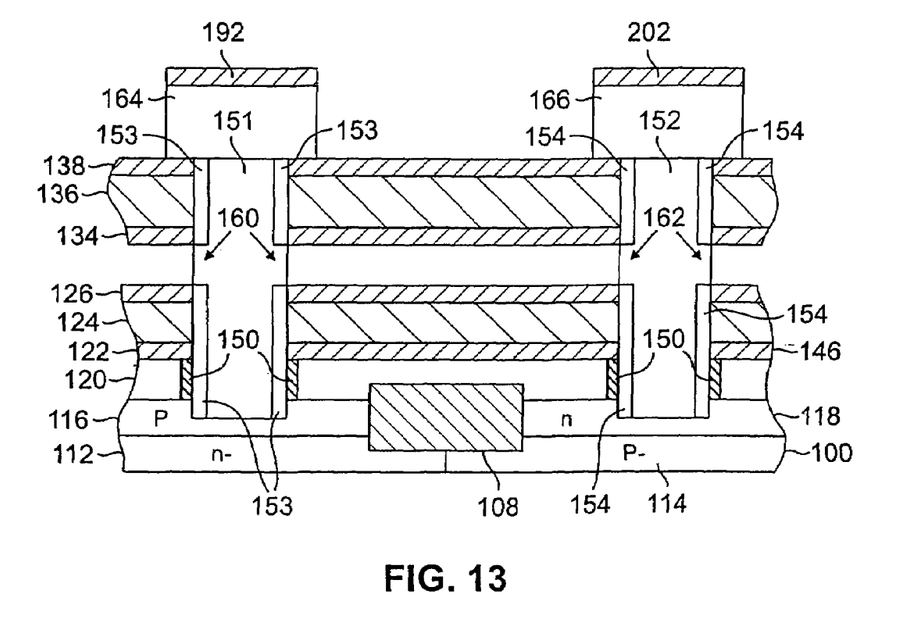
Figure 14:
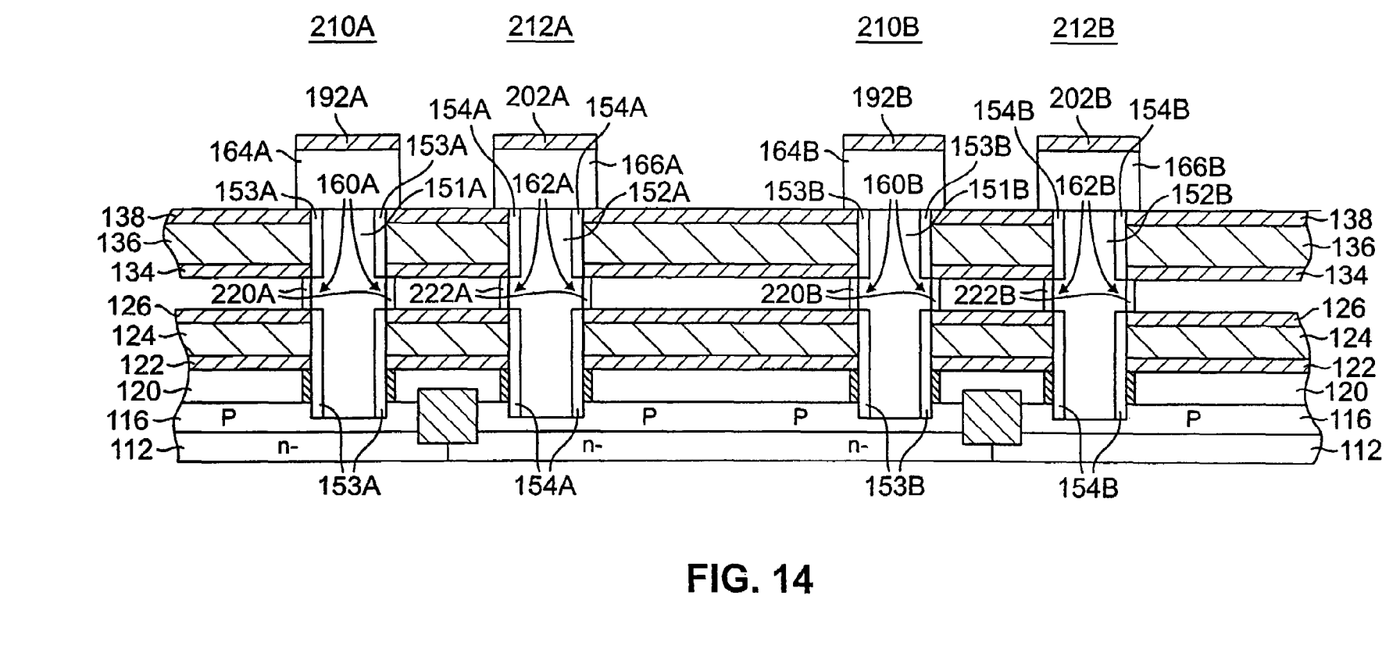

FIGS. 5 through 17 illustrate cross-sectional views of an integrated circuit structure 10 during various stages of fabrication to configure an exemplary circuit function according to the present invention. From the description, it will become apparent how a plurality of vertical CMOS transistors may be configured alone or in combination with other devices, e.g., bipolar junction transistors, capacitors or resistors, to form an integrated circuit. The completed circuit structure of FIGS. 13 and 14 illustrates the different gate oxide thicknesses in accordance with the teachings of the present invention.

Figure 5:
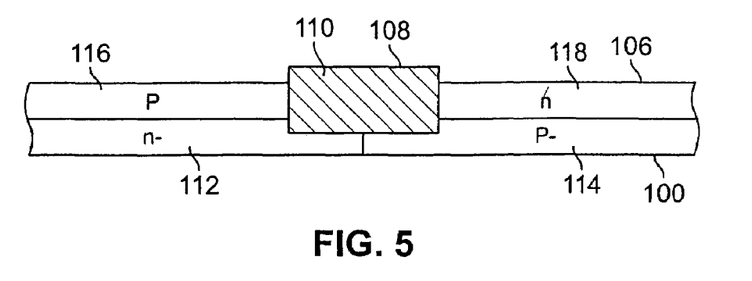
FIGS. 5 through 17 illustrate, in cross-section, a circuit structure according to one embodiment of the invention during sequential fabrication steps.

Referring to FIG. 5, there is shown a monocrystalline semiconductor layer 100 having an exposed major surface 106 formed along a crystal plane over an upper portion of the layer 100. An isolation trench 108, formed in the surface 106 by conventional techniques, is filled with deposited silicon dioxide 110. One purpose of the trench is to effect electrical isolation between two regions over which an exemplary pair of complementary field-effect transistors is to be formed. In this example, an n-tub region 112 and a p-tub region 114 are conventionally formed in electrical isolation along the surface 106 each on a different side of the trench 108. For example, the n-tub region 112 may be formed with a boron implant (300 to 500 keV, $1\times10^{13}/cm^2$) and the p-region 114 may receive a phosphorous implant (300 to 500 keV, $1\times10^{13}/cm^2$). Following formation of the tub regions 112 and 114, a p-type source/drain region 116 is formed in the tub region 112 and an n-type source/drain region 118 is formed in the tub region 114. Both source/drain regions are formed along the surface 106 and may be formed by ion implantation, e.g., the p-type source/drain region 116 is formed by a 50 to 100 keV boron implant of $3\times10^{13}/cm^2$ to $10\times10^{15}/cm^2$ over the tub region 112, and the n-type source/drain region 118 is formed by a 50 to 100 keV phosphorous implant of $3\times10^{15}/cm^2$ to $10\times10^{15}/cm^2$ over the tub region 114.

Figure 6:
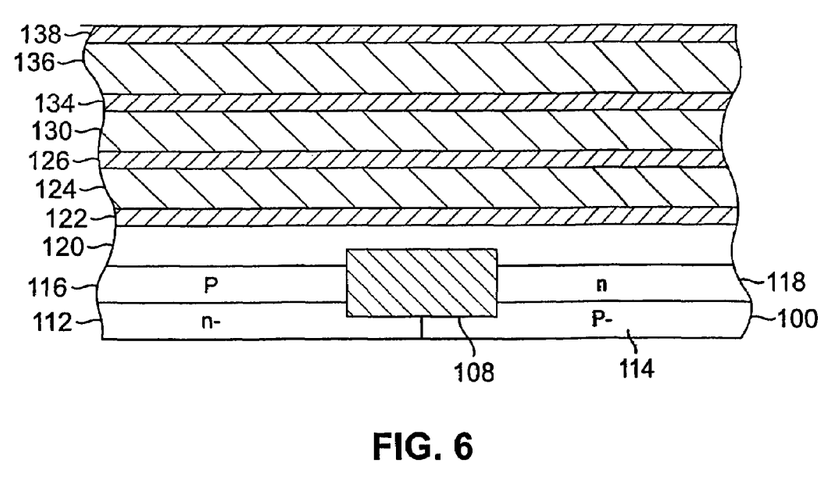

With reference to FIG. 6, multiple layers are formed over the semiconductor layer 100, beginning with a conductive layer 120 positioned adjacent or over the source/drain regions 116 and 118 and further extending over the isolation trench 108. To reduce the sheet resistance of the conductive layer 120, it should comprise metal and, in a preferred embodiment, is a metal silicide, such as tungsten silicide (WSi), formed by chemical vapor deposition. Alternative materials include cobalt silicide, as well as titanium nitride and tungsten nitride. Other low sheet resistance materials, especially those having a sheet resistance of less than 50 ohm/square, may be used to form the conductive layer 120. As further shown in FIG. 6, several layers of dielectric material are formed over the conductive layer 120, beginning with a thin insulative layer 122. Preferably, the layer 122 is formed of silicon nitride and has a thickness ranging between about 5 nm and about 50 nm to function as a diffusion barrier for n-type and p-type dopants diffusing by solid state diffusion as will be discussed below, and also as an etch stop layer. Over the layer 122 there is deposited a relatively thick insulative layer 124 followed by deposition of another thin insulative layer 126. The layer 126 also serves as a diffusion barrier and etch stop. Silicon nitride is contemplated as a suitable material for the insulative layer 126.

A layer 130 comprising silicon dioxide is deposited over the layer 126. The layer 130 is a sacrificial layer, which is later removed according to the replacement gate process as taught in the above-referenced U.S. Pat. No. 6,027,975. The thickness of the layer 130 defines the length of the subsequently formed MOSFET gates. The silicon dioxide of the layer 130 may be formed by a conventional deposit from a tetraethyorthosilicate (TEOS) precursor.

Insulative layers 134, 136 and 138 are next deposited over the silicon dioxide layer 130. The layer 134, preferably silicon nitride, is similar in thickness and function to the layer 126. The two layers 126 and 134 on either side of the layer 130 will later provide offset spacer and etch stop functions. They each have a thickness ranging between about 5 nm and about 50 nm and generally comprise material that resists etching during removal of the layer 130. In particular the thickness of these etch stop layers is largely dependant upon the resistance of the etch stop material to the selected etchant, relative to the depth of the material in an overlying or underlying layer to be removed during the etching process. That is, to be an effective etch stop, the etchant cannot penetrate the etch stop layer during the time the etchant is etching the layer or layers to be removed. Both the layers 126 and 134 also function as dopant diffusion barriers for the n-type and p-type dopants that, as will be discussed below, are diffused by solid phase diffusion from the layers 124 and 136, thereby defining the spacing and length of subsequently formed source/drain extensions relative to the gate of each transistor.

During subsequent processing steps described below, the insulative layers 124 and 136 serve to dope channel regions to form source/drain extensions of each transistor through a solid phase diffusion process, creating low-resistance extension regions adjacent the gate oxide. Examples of silicon oxide doping sources are PSG (phosphosilicate glass, i.e. a phosphorous doped silicon oxide) and BSG (boro-silicate glass, i.e., a boron-doped silicon oxide), which can be deposited, for example, by plasma-enhanced chemical vapor deposition (PECVD). Suitable thicknesses for the layers 124 and 136 are in the range of about 25 nm to about 250 nm. To this end, both the layers 124 and 136 contain a high concentration (on the order of $1\times10^{21}/cm^3$) of dopant. To create both n and p-type transistors in this CMOS device, the layers 124 and 136 must be bifurcated to provide the appropriate dopant-type for the corresponding transistor. One means for achieving this is to deposit a uniform film of one dopant type; then with conventional lithography, mask and etch to remove portions of the deposited layer. Next, a layer of the opposite dopant type is selectively deposited in the region that was removed. In another embodiment, an undoped layer is deposited. One region of the layer is masked and a first dopant type implanted in the unmasked region. Then the implanted region is masked and a second dopant type implanted in the unmasked region. As they are formed, both the layers 124 and 136 are planarized using a chemical/mechanical process (CMP).

A layer 138 is formed over the layer 136 and is comparable to the layers 126 and 134 in material composition and thickness. The layer 138 functions as a CMP stop layer in subsequent processing and thus has a thickness consistent with this function, e.g., at least about 25 nm. The layer 138 also serves as a diffusion barrier for both n- and p-type dopants during the solid phase diffusion process.

All of the layers 122, 124, 126, 130, 134, 136 and 138 may be deposited using conventional chemical vapor deposition (CVD) processes or other well known deposition techniques. With regard to the aforedescribed sequence of layers, it should be noted that other embodiments may include significant variations, for example, fewer deposited layers. In any case, the resulting structure will form a vertical channel region for each of the field-effect transistors in the CMOS device.

Figure 7:
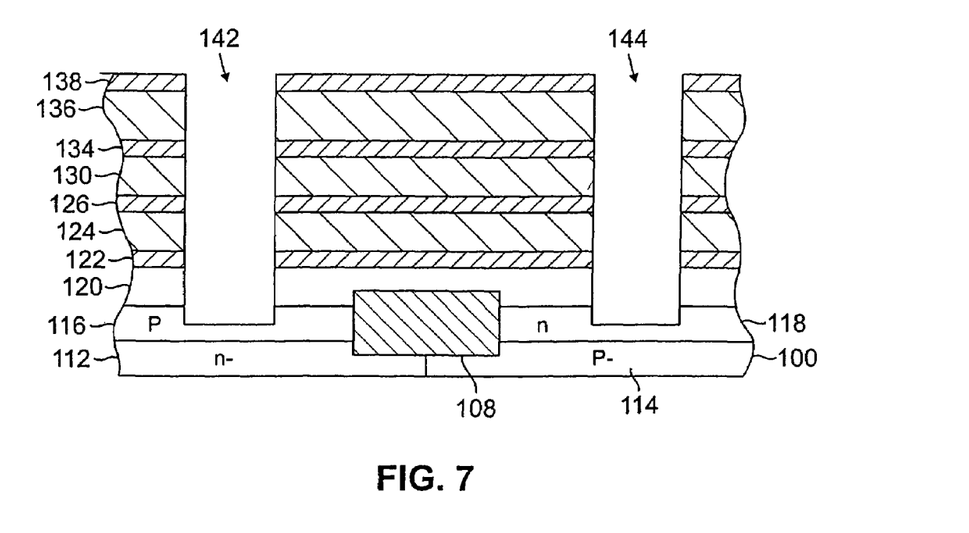
Figure 8:
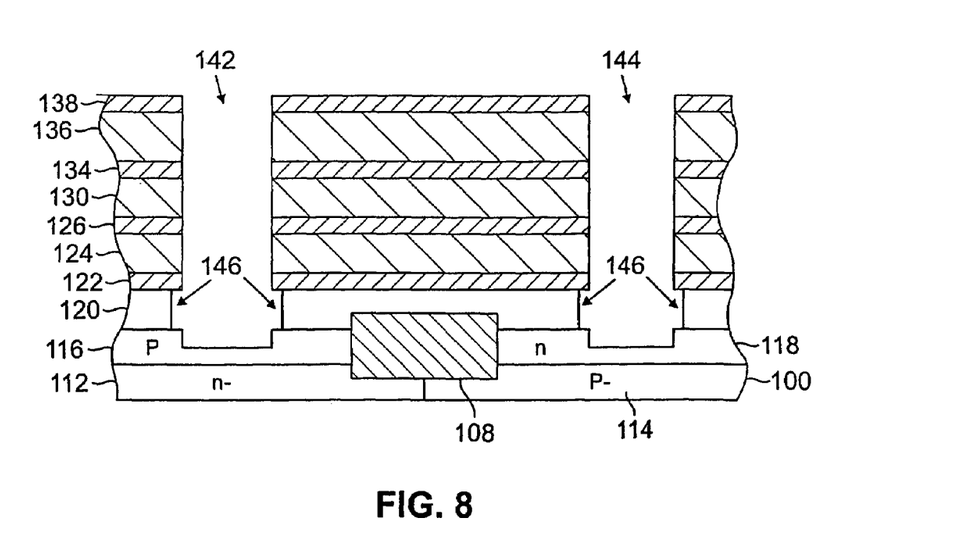

FIG. 7 illustrates a first trench or window 142 formed over the n-type tub region 112 and a second trench or window 144 formed over the p-type tub region 114. The trenches 142 and 144 are formed by conventional patterning with photoresist followed by anisotropic etch, which removes only vertical portions of the multiple layers, stopping at the source/drain regions 116 and 118. The etch chemistry and other details resulting in the formation of the trenches 142 and 144 are well known and are not further described herein As shown in FIG. 8, recesses 146 are created within the trenches 142 and 144 by a selective isotropic etch process that removes portions of the conductive layer 120 exposed during creation of the trenches 142 and 144. Selection of the appropriate etch chemistry is dependant upon composition of the conductive layer 120. For example, a suitable chemistry for a selective silicide wet etch is a mixture of sulfuric acid and hydrogen peroxide.

Figure 9:
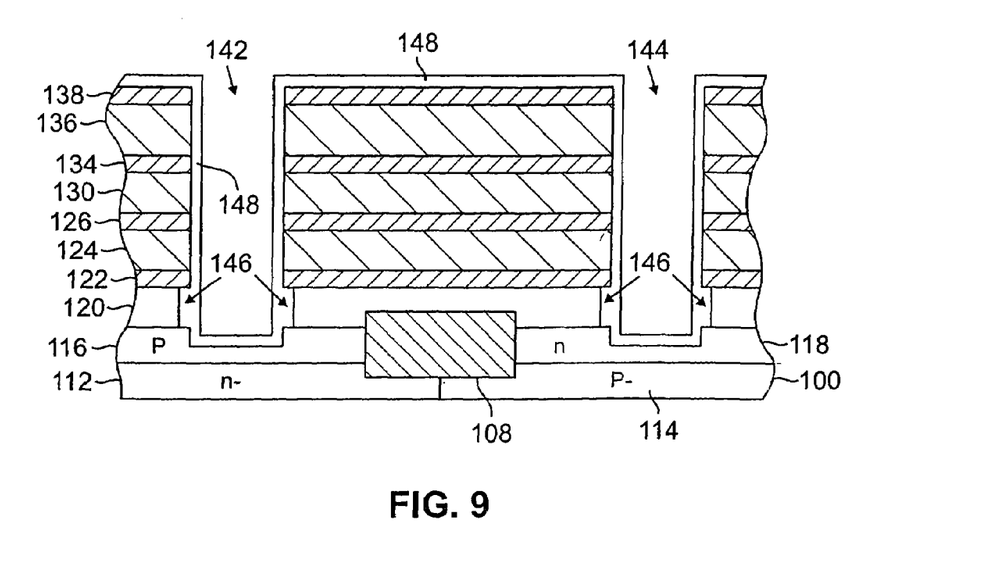
Figure 10:
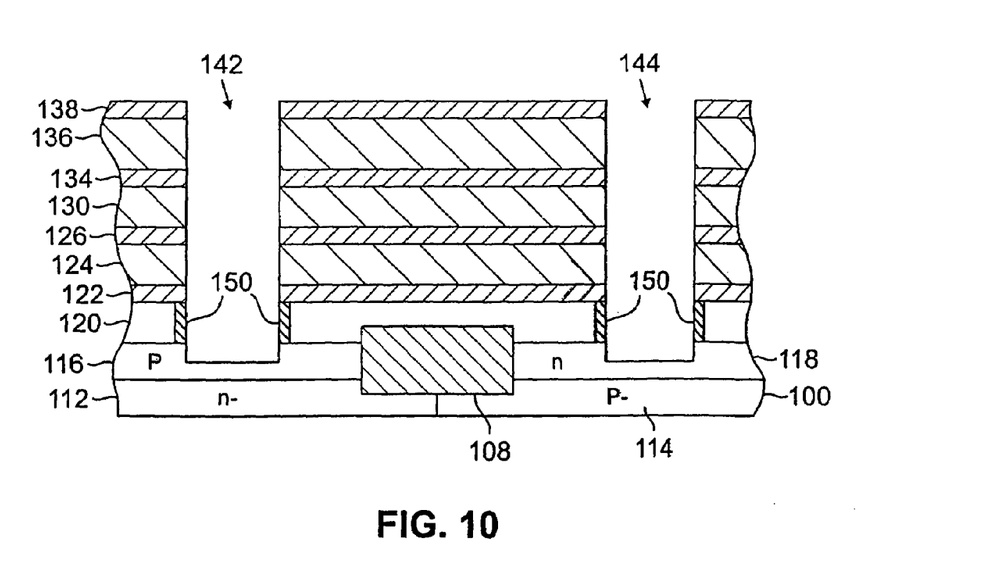
Figure 11:
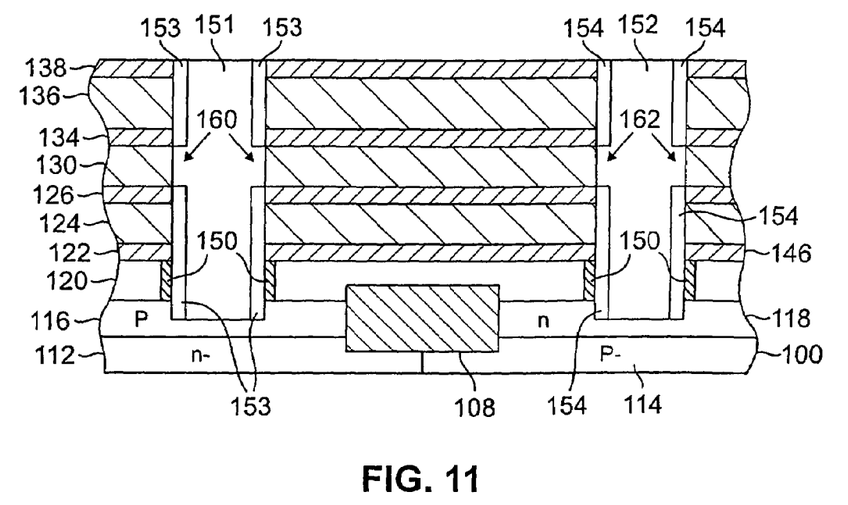

Following formation of the recesses 146, a thin conformal layer 148 of silicon dioxide is deposited along the walls and bottom of the trenches 142 and 144 as well as over the exposed surface of the layer 138. The silicon dioxide layer 148 also deposits within the recesses 146 as illustrated in FIG. 9.

An anisotropic etch of the silicon dioxide layer 148 removes the oxide from the bottom and much of the wall portions of the trenches 142 and 144 while allowing silicon dioxide dielectric regions 150 to remain in the recesses 146. See FIG. 10. Although the dielectric regions 150 comprise silicon dioxide in this embodiment, other insulative materials (doped or undoped) may be used instead.

With portions of the source/drain regions 116 and 118 exposed (See FIG. 11) by the etching process that created the trenches 142 and 144, monocrystalline silicon is now epitaxially grown from these regions at the bottom of the trenches 142 and 144 to form device-quality crystalline silicon layers 151 and 152 in the trenches 142 and 144, respectively. The crystalline silicon layer 151 is suitable for creating source/drain extension regions 153 above and below a channel region 160. The crystalline layer 152 is suitable for creating source/drain extension regions 154 above and below a channel region 162. The upper source/drain extensions 153 and 154 are formed by solid phase diffusion from the insulating layer 124 and the lower source/drain extensions 153 and 154 are formed by solid phase diffusion from the insulating layer 136, respectively. The channel region 160 may be undoped or lightly doped with an n-type material. The channel region 162 may be undoped or lightly doped with a p-type material. Preferably, the semiconductor material forming the channel regions 160 and 162 comprises silicon-germanium and silicon-germanium-carbon. If the channel regions 160 and 162 are formed in an undoped state, they may be later doped. Further, the crystalline material of the crystalline layers 151 and 152 may be deposited as an amorphous or polycrystalline layer and subsequently re-crystallized, e.g., by a conventional furnace anneal or laser anneal. Any portions of the crystalline layers 151 and 152 extending above the layer 138 are removed, for example, by CMP, which planarizes the crystalline layers 151 and 152 with the layer 138.

Figure 12:
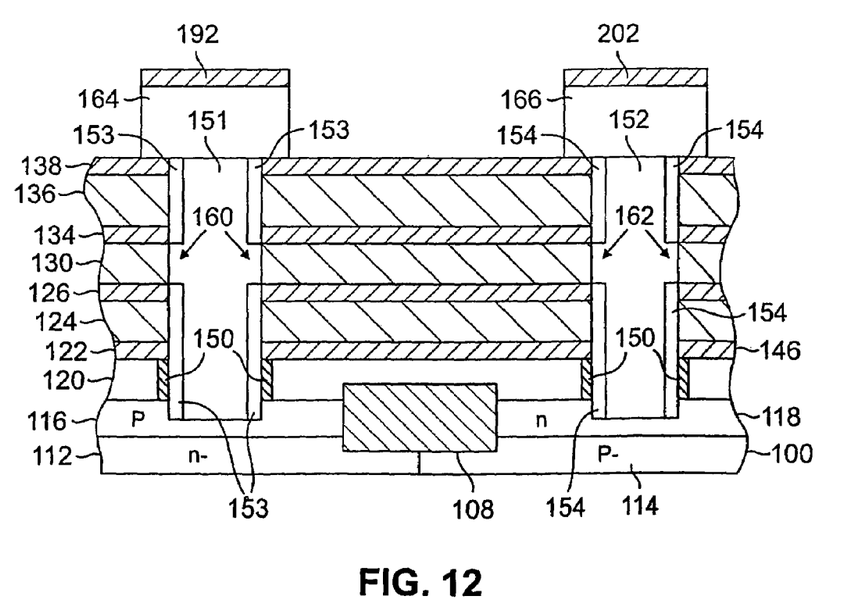

With reference to FIG. 12, polycrystalline pad regions 164 and 166 are then formed by standard deposition, implant, lithography and etch techniques. The pad regions 164 and 166 are suitably doped to provide source/drain regions with respect to the conductivity of each respective associated channel region 160 and 162. The pad regions 164 and 166 are each covered by a dielectric layer 192 or 202, respectively. Silicon nitride is deemed a suitable materials for the layers 192 and 202. After the layers 192 and 202 are deposited, the sacrificial silicon dioxide layer 130 is removed (e.g., with a selective HF etch). See FIG. 13.

Figure 15:
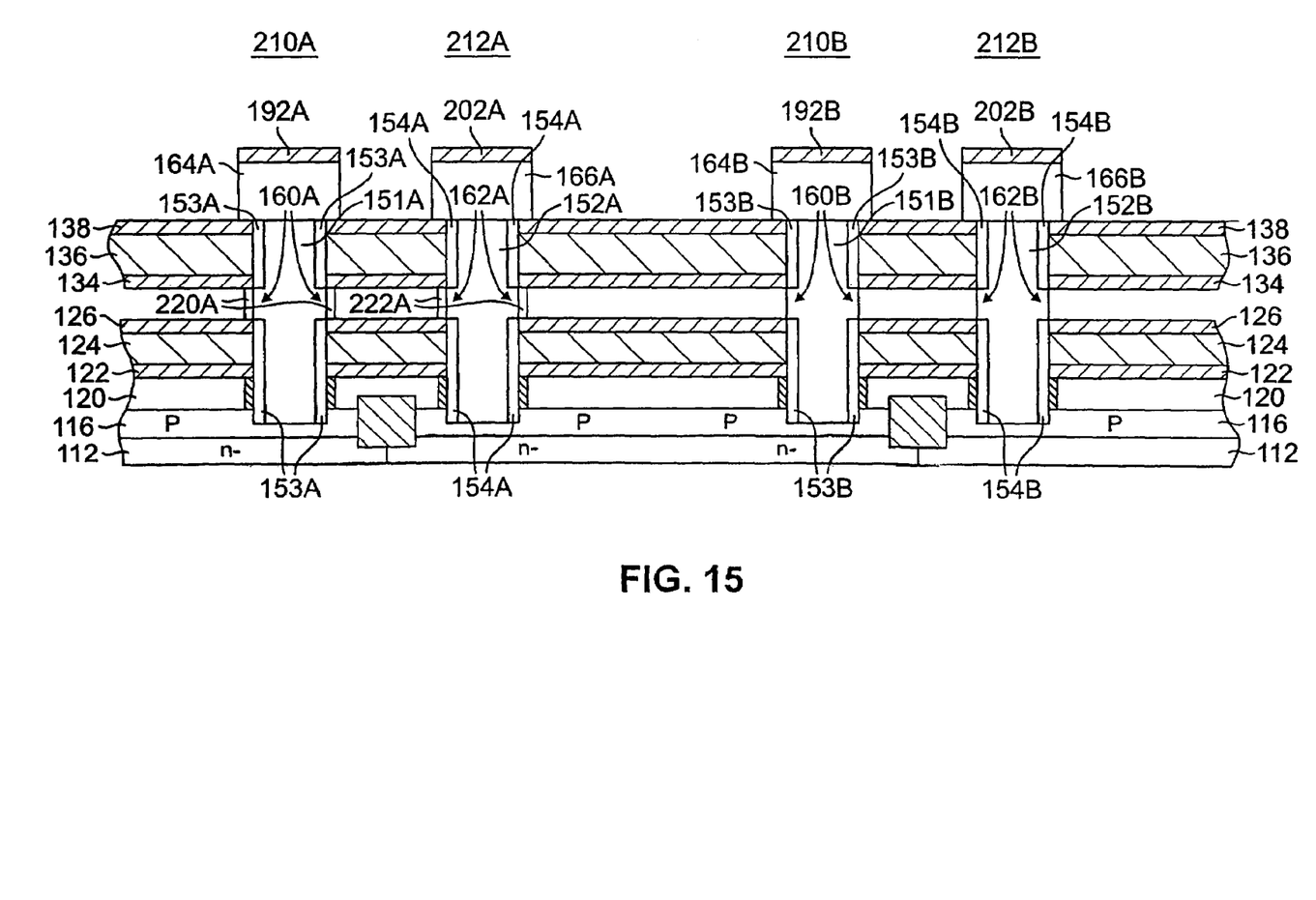
Figure 16:
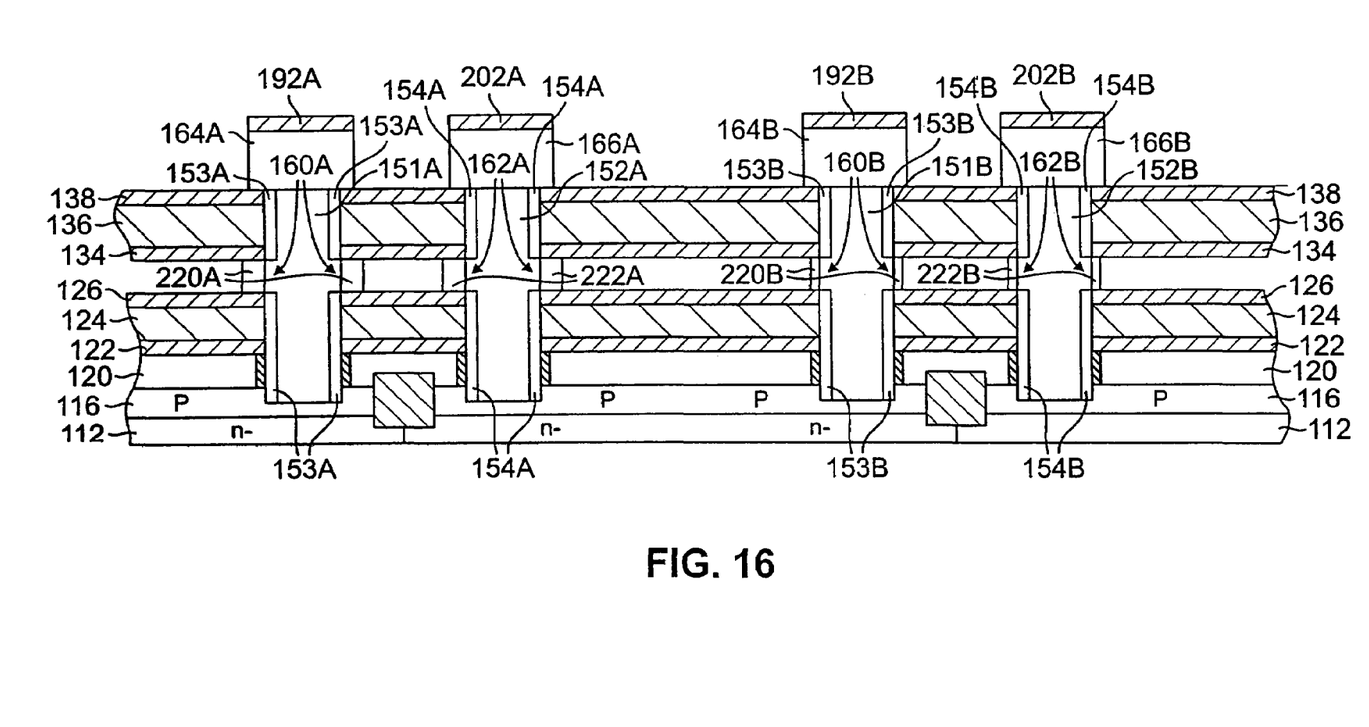

At this point in the process, the gate oxide dielectric regions are thermally grown. FIGS. 14 through 16 illustrate the process with reference to four MOSFETS 210A and 212A, which form a first CMOS pair, and 210B and 212B, which form a second CMOS pair. In this way, the teachings of the present invention are illustrated by application to two CMOS MOSFET pairs, where each pair operates at a different gate voltage, i.e., where the gate voltage is determined by the operating voltage of the previous stage in the circuit. At this stage in the fabrication process, the structure of the MOSFETs 210A, 212A, 210B and 212B of FIG. 14 is representative of the MOSFETs 180 and 190 of FIG. 13.

According to a preferred embodiment, vertical replacement gate CMOS transistors with different operating voltages are formed according to the following steps. As shown in FIG. 14, first, equal-thickness initial gate oxide layers 220A, 222A, 220B and 222B are grown in the channel regions 160A, 162A, 160B and 162B, respectively, of each vertical replacement gate transistor 210A, 212A, 210B and 212B. Assuming the MOSFETs 210A and 212A are intended to operate at higher operating voltages (and therefore require a thicker gate oxide layer), they are masked according to known lithography techniques. The initial oxide layers 220B and 222B are then removed from the non-masked MOSFETs 210B and 212B. See FIG. 15. The mask is removed and a second gate oxide deposition is performed. During this second gate oxidation the masked gate oxide regions 220A and 222A will grow thicker, although at a slower rate than the growth of a new oxide layers 220B and 222B on the non-masked MOSFETs 210B and 212B. See FIG. 16. Thus at the conclusion of the second gate oxide deposition process, two different gate oxide thicknesses have been formed. Relatively thick gate oxides 220A and 222A have been formed for the MOSFETs 210A and 212A, and relatively thin gate oxides 220B and 222B have been formed for the MOSFETs 210B and 212B. This process can be repeated any number of times to create any number of gate oxide thicknesses and can be applied to any number of MOSFETs on the integrated circuit.

Representative minimal gate oxide thickness values and the approximate operating voltage they will support are shown below.

| Gate oxide thickness (Angstroms) | Operating voltage ($V_{dd}$ in volts) |
| --- | --- |
| 20 | 1.5 |
| 36 | 2.5 |
| 50 | 3.0 |
| 110 | 5.0 |

Preferably, at this stage of the process dopants are driven into the crystalline layers 151 and 152 by solid phase diffusion from the insulative layers 126 and 134 to form the source/drain extensions 153 and 154. The advantage of using solid phase diffusion is that the source and drain extensions (and consequently the channel of the device) are aligned with what will become the gate of the final device. The concentration of the dopant in that portion of the crystalline layer 151 that is doped from the insulative layers 124 and 136 is typically about $1 \times 10^{19}/\text{cm}^3$ with dopant concentrations of about $5 \times 10^{19}/\text{cm}^3$ contemplated as advantageous. With this solid phase diffusion technique, very shallow source and drain extensions are obtainable. The source/drain extensions 153 and 154 are shown as penetrating into the crystalline layers 151 and 153, preferably less than one-half the width of the crystalline layers 151 and 153. Limiting the dopant penetrations in this manner avoids significant overlap in the doped regions from opposite sides of the crystalline layers 151 and 153. Also, the distance that the source/drain extensions 153 and 154 extend under the device gate (to be formed in subsequent processing steps explained below) is preferably limited to less than one-fourth of the gate length, thereby limiting the overlap capacitance. As is known to those skilled in the art, the dopants in the source/drain extensions 153 and 154 are of the opposite conductivity type from the dopants in the channels 160 and 162.

Figure 17:
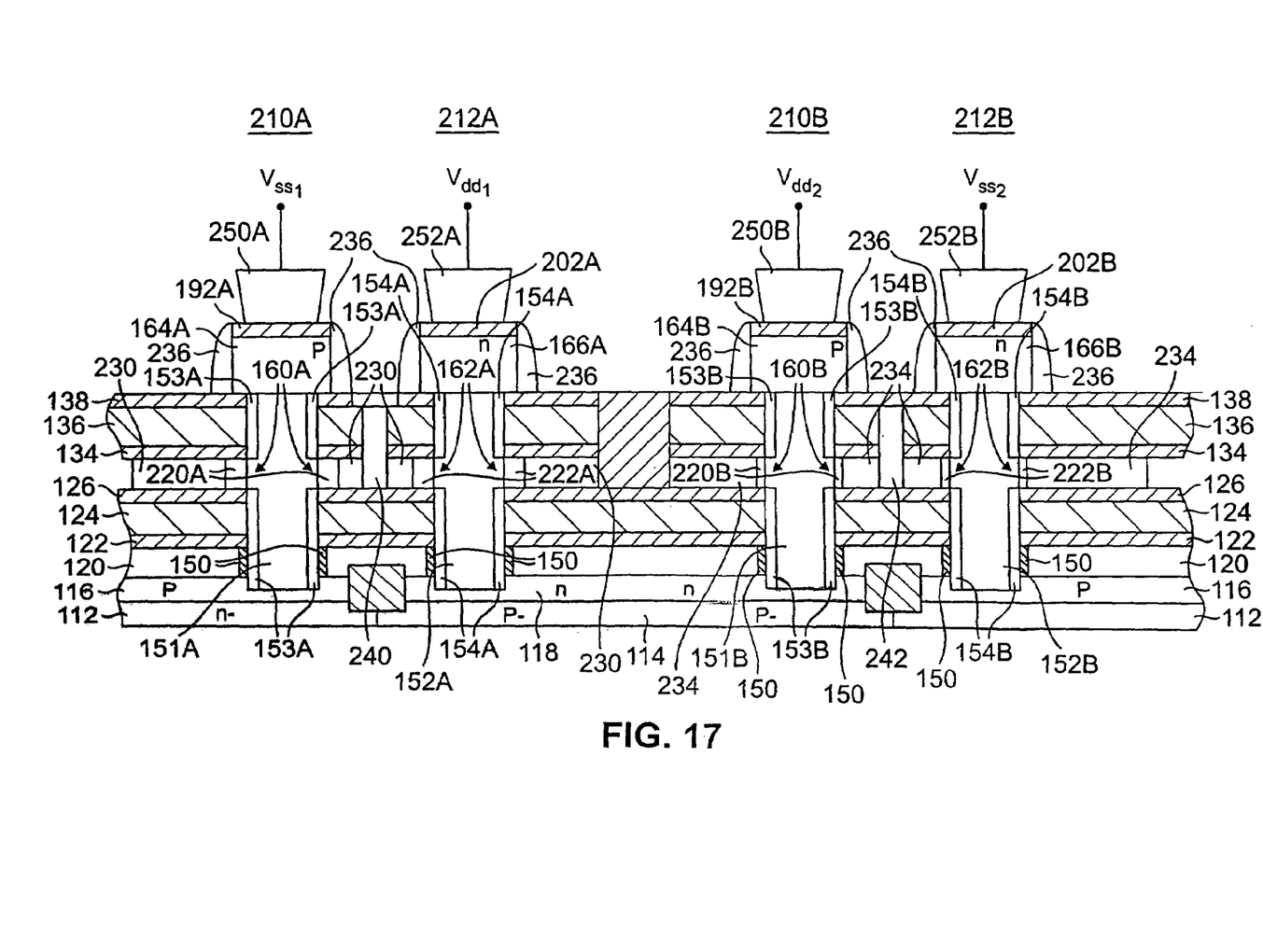

As shown in FIG. 17, next the polysilicon gate regions 230 and 234 are deposited. The gate 230 pertains to the MOSFETs 210A and 212A for controlling conduction through the channels 160A and 162A. The gate 234 pertains to the MOSFETs 210B and 212B for controlling conduction through the channels 160B and 162B. The gate regions 230 and 234 are formed over, but separated from, the conductive layer 120 by the interposing insulative layers 122, 124 and 126. Portions of the silicon nitride layers 134 and 138 and the silicon dioxide layer 136 are positioned over the gate regions 230 and 234.

As described above, the layers 192A and 192B overlie portions of the source/drain regions 164A and 164B. The layers 202A and 202B overlie portions of the source/drain region 166A and 166B. Dielectric spacers 236 adjacent opposing sides of each plug 164A, 164B, 166A and 166B are formed by conventional deposition, mask and etch steps, and are preferably of composed of silicon nitride. Gate input contacts 240 and 244 are connected, respectively, to the gates 230 and 234 to alternately bring one MOSFET in a CMOS pair into a conduction state.

The conductive layer 120 is preferably a continuous film, electrically connecting the source/drain region 116 of the MOSFET 210A with the source/drain region 118 of the MOSFET 212A. The insulative regions 150 isolate the conductive layer 120 from direct contact with each of the source/drain extensions 153A and 154A. If the insulative regions 150 were not present, the interface between the conductive layer 120 and the crystalline silicon could develop dislocations effecting electrical performance. In addition to eliminating area intensive contact windows to affect connection between the source/drain regions 116 and 118, the conductive layer 120 provides a low sheet resistance connection between the source/drain regions 116 and the source/drain regions 118.

The source/drain regions 164A, 168A, 164B and 166B may each serve as a source region connected to different voltage rails, e.g., $V_{dd}$ and $V_{ss}$, via respective contacts 250A, 252A, 250B and 252B. See FIG. 17. The source/drain regions 116 and 118 may each serve as drain regions. The MOSFET 210A and the MOSFET 212A operate as a first inverter with the input signal applied to the gate input contact 240 and the output signal at the source/drain regions 116 and 118 of the MOSFET 210A and the MOSFET 212A, respectively. The MOSFET 210B and the MOSFET 212B operate as a second inverter with the input signal applied to the gate input contact 242 and the output signal at the source/drain regions 116 and 118 of the MOSFET 210B and the MOSFET 212B, respectively. With reference to the circuits of FIG. 3, the PMOS 70 and the NMOS 72 are implemented by the MOSFETs 210A and 212A. The PMOS 74 and the NMOS 76 are implemented by the MOSFETs 210B and 212B. A conventionally formed shallow trench isolation structure 270 isolates the first inverter from the second inverter in the FIG. 17 embodiment.

Figure 18:
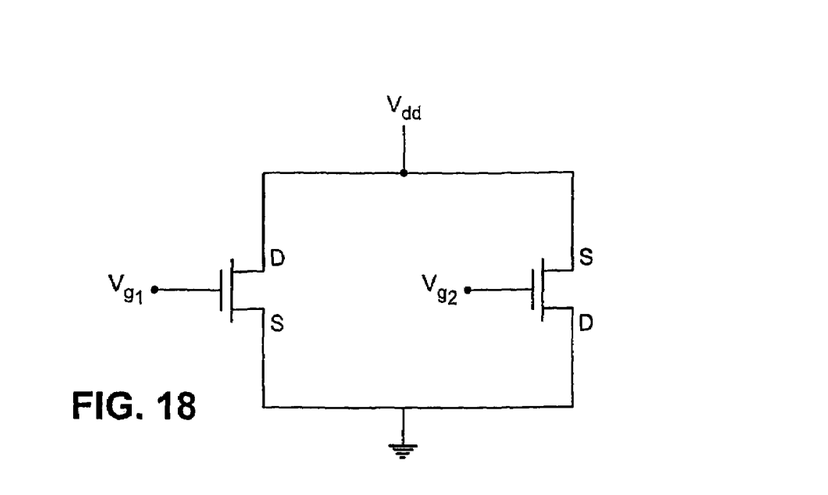
FIG. 18 is a schematic diagram of CMOS devices constructed according to another embodiment of the present invention.

In another embodiment of the present invention, two MOSFETs 300 and 302 (See FIG. 18) are formed as described above with different oxide thicknesses, but their respective source and drain terminals electrically connected to form two parallel independently-controlled MOSFETs. The gates are electrically isolated using conventional trench or local oxidation of silicon (LOCOS) techniques. The MOSFETs have a different gate oxide thickness, and thus each has a different threshold voltage.

Returning to the FIG. 3 schematic, note that each MOSFET pair (PMOS 70/NMOS 72 and PMOS 74/NMOS 76) is responsive to a different supply voltage ($V_{dd}/V_{ss}$). If $V_{in_1}$ is set equal to $V_{in_2}$, by connecting the MOSFET gate terminals, and, $V_{out_1}$ is set equal to $V_{out_2}$ by connecting the two output terminals, the resulting device represents a tertiary logic device, having one logic level if the first MOSFET pair (PMOS 70/NMOS72) is in conduction, a second logic level if the second MOSFET pair (PMOS 74/NMOS 76) is in conduction and a third logic level if both MOSFET pairs are off.

Although the present invention has been described in conjunction with the formation of MOSFET devices configured to form simple CMOS integrated circuits, those skilled in the art will recognize that the teachings of the present invention can be applied to the formation of multiple VRG MOSFET devices on an integrated circuit. By controlling the gate oxide thickness of each VRG MOSFET through deposition, masking and further deposition steps, an integrated circuit is created, wherein each MOSFET operates at a different selected operating voltage. An architecture has been described that is useful for providing multiple operating voltage replacement gates CMOS transistors in a circuit structure. While specific applications of the invention have been illustrated, the principals disclosed herein provide a basis for practicing the invention in a variety of ways and a variety of circuit structures, including structures formed with Group III-IV compounds and other semiconductor materials. Although the exemplary embodiments pertain to voltage replacement gate CMOS MOSFETs, numerous variations are contemplated. These include structures utilizing a conductor layer, such as the conductor layer 120, to connect other types of semiconductor devices (such as vertical bipolar transistor devices, diodes and, more generally, diffusion regions) with other devices or regions in a semiconductor layer. Still other constructions not expressly identified herein do not depart from the scope of the invention, which is limited only by the claims that follow.

The invention claimed is:

1. A method for fabricating a semiconductor device with a plurality of field-effect transistors comprising:
   forming a first device region, selected from the group consisting of a source region and a drain region, of a first field-effect transistor on a semiconductor layer;
   forming a second device region, selected from the group consisting of a source region and a drain region, of a second field-effect transistor on said semiconductor layer;
   forming a first channel region over and in contact with said first device region, wherein said first channel region has an opposite conductivity type than the first device region;
   forming a second channel region over and in contact with said second device region, wherein said second channel region has an opposite conductivity type than the second device region;
   forming a gate adjacent said first channel region for said first field-effect transistor, wherein said gate has a first predetermined gate oxide thickness; and
   forming a gate adjacent said second channel region for said second field-effect transistor, wherein said gate has a second predetermined gate oxide thickness, and wherein said first predetermined thickness is different than the second predetermined thickness.

2. The method of claim 1 including the additional step of configuring the first and the second device regions, and the first and the second gate regions into a circuit comprising two MOSFETs.

3. The method of claim 1 wherein the step of forming the gate having the first predetermined gate oxide thickness and the step of forming the gate having the second predetermined gate oxide thickness, comprises:
   forming a gate for the first field-effect transistor, wherein said gate has a first predetermined gate oxide thickness;
   forming a gate for the second field-effect transistor, wherein said gate has a first predetermined gate oxide thickness;
   removing the oxide from said gate of the first field-effect transistor;
   forming gate oxide material on said gate for said first field-effect transistor;
   forming gate oxide material on said gate for said second field-effect transistor; and
   such that the gate oxide of the first field-effect transistor has a thickness less than the thickness of the gate oxide for the second field-effect transistor.

4. The method of claim 1 wherein the first and the second field-effects transistors can withstand different gate input voltages as a consequence of the differing predetermined gate oxide thickness.

5. A method for fabricating a semiconductor device with a plurality of transistors comprising:
   forming first and second spaced-apart diffusion regions on a semiconductor layer;
   forming a first channel region over and in contact with said first diffusion region, wherein said first channel region has an opposite conductivity type than said first diffusion region;
   forming a second channel region over and in contact with said second diffusion region wherein said second channel region has an opposite conductivity type than said second diffusion region;
   forming a first gate oxide of a first predetermined thickness adjacent said first channel region;
   forming a second gate oxide of a second predetermined thickness adjacent said second channel region, wherein the first predetermined thickness is different from the second predetermined thickness;
   forming fifth and sixth semiconductor regions, each positioned over one of said first and said second channel regions, such that said first channel region and said fifth region are vertically aligned with one of said first and said second regions, and such that said second channel region and said sixth region are vertically aligned with the other of said first and second regions, the resulting structure providing two transistors with a substantially vertical current flow through the first and the second channel regions.

6. The method of claim 5 wherein the step of forming the first gate oxide of a first predetermined thickness adjacent the first channel region and the step of forming the second gate oxide of the second predetermined thickness adjacent the second channel region comprises:

forming a first gate oxide of a first predetermined thickness adjacent said first channel region;

forming a second gate oxide of said first predetermined thickness adjacent said second channel region;

removing said first gate oxide;

forming a third gate oxide of a second predetermined thickness adjacent said first channel region;

forming said third gate oxide of said third predetermined thickness adjacent said second channel region; and wherein the gate oxide thickness adjacent said second channel region is the sum of said first predetermined thickness plus said second predetermined thickness.

7. The method of claim 5 wherein the first and the second gate oxides are associated with a first and a second MOSFET, and wherein said first and said second MOSFETs form a complementary MOSFET device, and wherein the gate terminals of said first MOSFET has a first breakdown voltage related to the first predetermined thickness, and wherein the gate terminals of said second MOSFET has a second breakdown voltage related to the second predetermined thickness.

* * * * *